United States Patent [19]

Younger et al.

[11] Patent Number: 5,306,660
[45] Date of Patent: Apr. 26, 1994

[54] TECHNIQUE FOR DOPING MERCURY CADMIUM TELLURIDE MOCVD GROWN CRYSTALLINE MATERIALS USING FREE RADICAL TRANSPORT OF ELEMENTAL INDIUM AND APPARATUS THEREFOR

[75] Inventors: Charles R. Younger, Anaheim Hills; Shawn L. Johnston, Moorpark; Stuart J. C. Irvine, Moorpark; Edward R. Gertner, Moorpark; Kenneth L. Hess, Yorba Linda, all of Calif.

[73] Assignee: Rockwell International Corporation, Seal Beach, Calif.

[21] Appl. No.: 657,692

[22] Filed: Feb. 19, 1991

[51] Int. Cl.$^5$ .................................. H01L 21/365
[52] U.S. Cl. ..................... 437/81; 437/168; 437/965; 437/971; 148/DIG. 64; 156/606; 156/613; 156/614
[58] Field of Search .......... 437/965, 971, 168, 81; 148/DIG. 41, DIG. 64; 156/DIG. 72, DIG. 82, 613, 614, 606, 613

[56] References Cited

U.S. PATENT DOCUMENTS

| | | | |
|---|---|---|---|
| 4,368,098 | 1/1983 | Manasevit | 156/606 |
| 4,404,265 | 9/1983 | Manasevit | 148/33 |
| 4,422,888 | 12/1983 | Statius | 437/965 |
| 4,439,267 | 3/1984 | Jackson, Jr. | 437/81 |
| 4,504,329 | 3/1985 | Quinlan et al. | 156/613 |
| 4,566,918 | 1/1986 | Irvine et al. | 156/613 |
| 4,568,397 | 2/1986 | Hoke et al. | 437/965 |
| 4,650,539 | 3/1987 | Irvine et al. | 156/613 |
| 4,804,638 | 2/1989 | Hoke et al. | 437/965 |
| 4,908,329 | 3/1990 | Kanai et al. | 148/DIG. 64 |
| 4,950,621 | 8/1990 | Irvine et al. | 437/81 |
| 4,960,728 | 10/1990 | Schaake et al. | 148/DIG. 64 |
| 5,202,283 | 4/1993 | Younger et al. | 437/81 |

FOREIGN PATENT DOCUMENTS

| | | | |
|---|---|---|---|
| 1-313396 | 12/1989 | Japan | 156/613 |
| 2-142145 | 5/1990 | Japan | 437/965 |
| 2-244713 | 9/1990 | Japan | 156/613 |

OTHER PUBLICATIONS

Hagihara et al. editors, Handbook of Organometallic Compounds, W. A. Benjamin Inc., 1968, p. 182.

Primary Examiner—Olik Chadhuri
Assistant Examiner—Ourmazd S. Ojan
Attorney, Agent, or Firm—H. Fredrick Hamann; George A. Montanye; Tom Streeter

[57] ABSTRACT

Method and apparatus for vapor phase free methyl radical transport of indium dopant species for precise predetermined reproducible doping concentrations to control electrical properties for MOCVD grown materials.

17 Claims, 12 Drawing Sheets

TECHNIQUE FOR DOPING MERCURY CADMIUM TELLURIDE MOCVD GROWN CRYSTALLINE MATERIALS USING FREE RADICAL TRANSPORT OF ELEMENTAL INDIUM AND APPARATUS THEREFOR

This invention was made with Government support under Contract No. DAAB07-89-C-F203 awarded by the Army. The Government has certain rights in this invention.

This application is related to U.S. Ser. No. 656,940 concurrently filed by Younger et al. entitled TECHNIQUE FOR DOPING MOCVD GROWN CRYSTALLINE MATERIALS USING FREE RADICAL TRANSPORT OF THE DOPANT SPECIES AND APPARATUS THEREFOR and assigned to a common assignee.

BACKGROUND OF THE INVENTION

1. Field of the Invention

The invention relates, in general, to semiconductor fabrication using metalorganic chemical vapor deposition crystal growth, and more particularly to vapor phase transport of the dopant species indium by methyl free radicals, for controlled doping in a reproducible manner.

2. Prior Art

The Manasevit patents 4,368,098 and 4,404,265 describe methods and apparatus for growing thin film single crystal Group III-V wide band-gap compound semiconductors, wherein the thin film may be produced in situ on a heated substrate in an MOCVD reactor by reaction of an organic compound containing a Group III constituent with a Group V hydride.

These patents are assigned to a common assignee of the present application, and techniques disclosed in the patents are used in the present invention.

In the manufacturing of electrically active mercury cadmium telluride single crystal materials by metalorganic chemical vapor deposition (MOCVD), precise control over the carrier concentration in the materials is essential. A common way to control carrier type and concentration is by intentionally doping the material during growth with a dopant species which will provide the correct carrier type at the desired concentration in the crystalline material.

The problem which has existed with present doping schemes in MOCVD growth is a lack of precise control and reproducibility at low dopant concentrations. One of these schemes which exhibits problematic behavior is alkyl-doping. This is where the dopant species is introduced in the form of a presynthesized metalorganic chemical, and is subsequently decomposed in the growth zone of the crystal growth reaction chamber by heat energy which emanates from a localized heat source, as in the Manasevit patents (supra). The dopant flux in this arrangement is controlled by the partial pressure of the metalorganic compound in the gas phase. The partial pressure is established by the concentration of metalorganic compound in the vapor transporting the compound as a diluent gas, hydrogen, through a network of stainless steel tubing which interconnects the chemical source and the reaction chamber. One problem that occurs with this configuration is the intolerable decay of dopant levels due to condensation, and/or adsorption/desorption processes, of the metalorganic chemicals in the transport lines. This is commonly referred to as the "memory effect." It is this memory effect which complicates the issue of fabricating abrupt transitions in electrically active dopant species. This memory effect phenomena may require numerous growth runs, in which the dopant species is *not* introduced, for the dopant concentration to fall below deleterious levels.

SUMMARY OF THE INVENTION

The present invention uses free methyl-radicals, to transport the indium dopant species in the vapor phase to the growing mercury cadmium telluride crystal. These radicals are a byproduct of the normal decomposition of the primary alkyl constituents used in crystal growth by MOCVD. This technique, referred to as "free radical doping," uses a low-mass elemental indium dopant source target, in proximity to the growth substrate. A localized heat source collectively elevates the temperatures of the substrate and indium target, both of which are mounted on a heated block in the reactor, and it is the heat from this block that causes the chemical reactions to take place in the reactor. The block may comprise a graphite susceptor for holding the substrate and the heat from the susceptor, causes the free methyl-radicals to react with the indium source target for a temporary transient synthesis of a reactive metalorganic species. This reactive species is then transported in the vapor phase to the substrate where surface decomposition releases the elemental indium species for incorporation into the growing mercury cadmium telluride material. The gas phase dopant flux can be precisely controlled by varying the mass of the dopant source target, the concentration of free radicals for transport, and/or the heat of the indium source.

With this technique there is no run-to-run memory effect or accumulation of dopants, as with alkyl-doping, and the reproducibility and control of indium dopant levels is better than any other known technique for in-situ doping during MOCVD growth. Thus, one product application of the MOCVD grown mercury cadmium telluride invention is for use in long wave infrared detectors.

BRIEF DESCRIPTION OF THE DRAWINGS

FIGS. 4, 5, and 6 show that the dopant uniformity within this layer is at 11.5%, which is outstanding considering that dopant concentrations are a logarithmic function of dopant input flux;

DETAILED DESCRIPTION OF A PREFERRED EMBODIMENT OF THE INVENTION

FIGS. 1, 2, 3, and 3A diagram one configuration for susceptor doping in carrying out the preferred method of the present invention.

Figure 1:
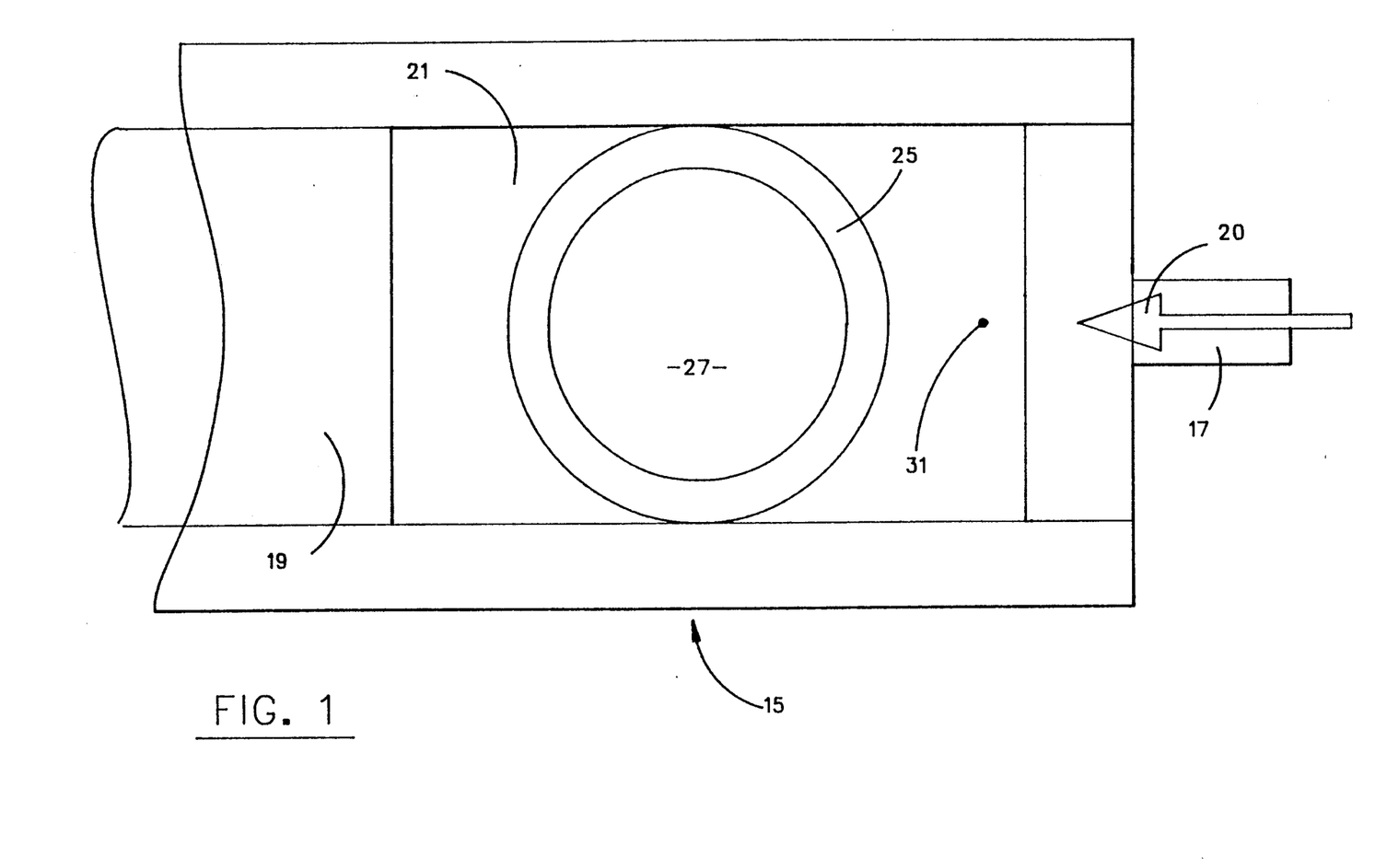
FIG. 1 is a plan view of a portion of a reactor capable of carrying out the preferred method of the present invention.
Figure 2:
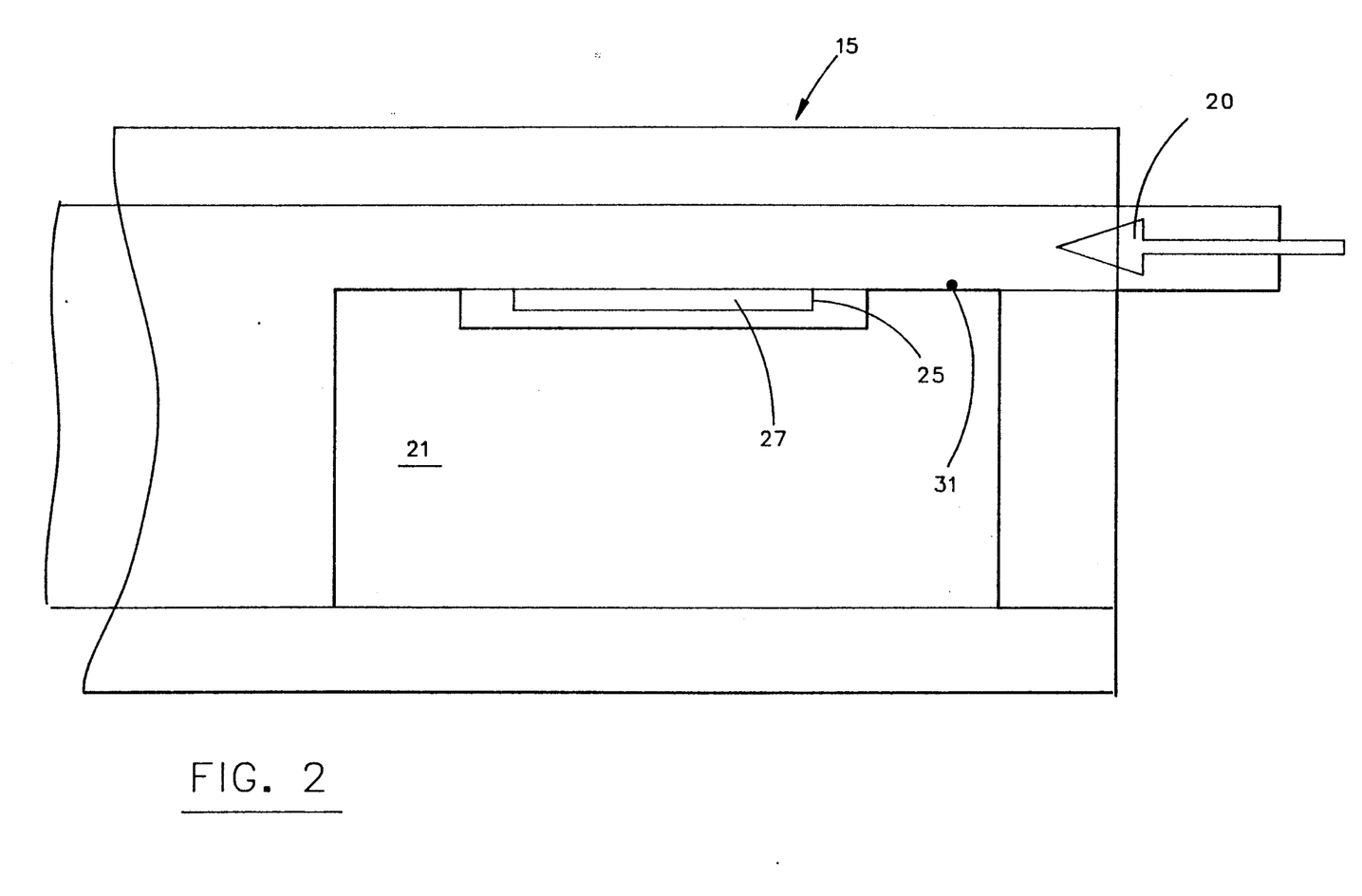
FIG. 2 is a view of the structure of FIG. 1 in side elevation.

In FIG. 1, the open continuous flow reactor pressure vessel is shown at 15 having an inlet 17 for metalorganic reactants with a reactor flow channel 19 extending through and exiting the reactor pressure vessel 15. In the flow channel 19, there is positioned a susceptor 21 which can be an RF heated graphite block. A rotating recessed table 25 is disposed in the upper portion of the graphite block 21 to carry the substrate 27 upon which the semiconductor being doped is formed.

Figure 3:
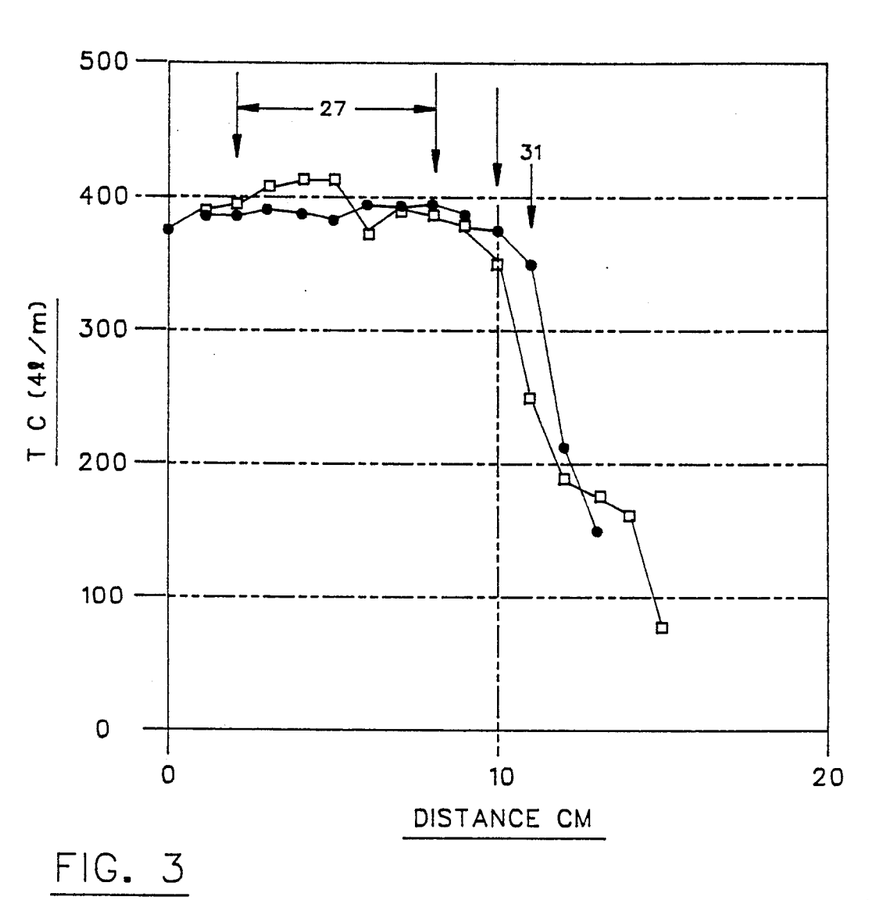
FIG. 3 is a plot of temperature distribution across the reactor relative to the substrate and target source versus separation in centimeters.
Figure 3A:
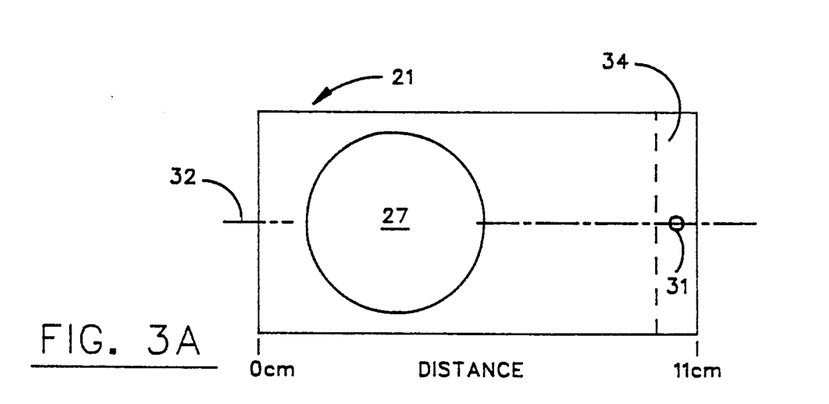
FIG. 3A is a sketch, in plan view, to show the substrate relative to the dopant source, which for this example is indium, and indicate the line along which the temperature profile of FIG. 3 was taken.
Figure 4:
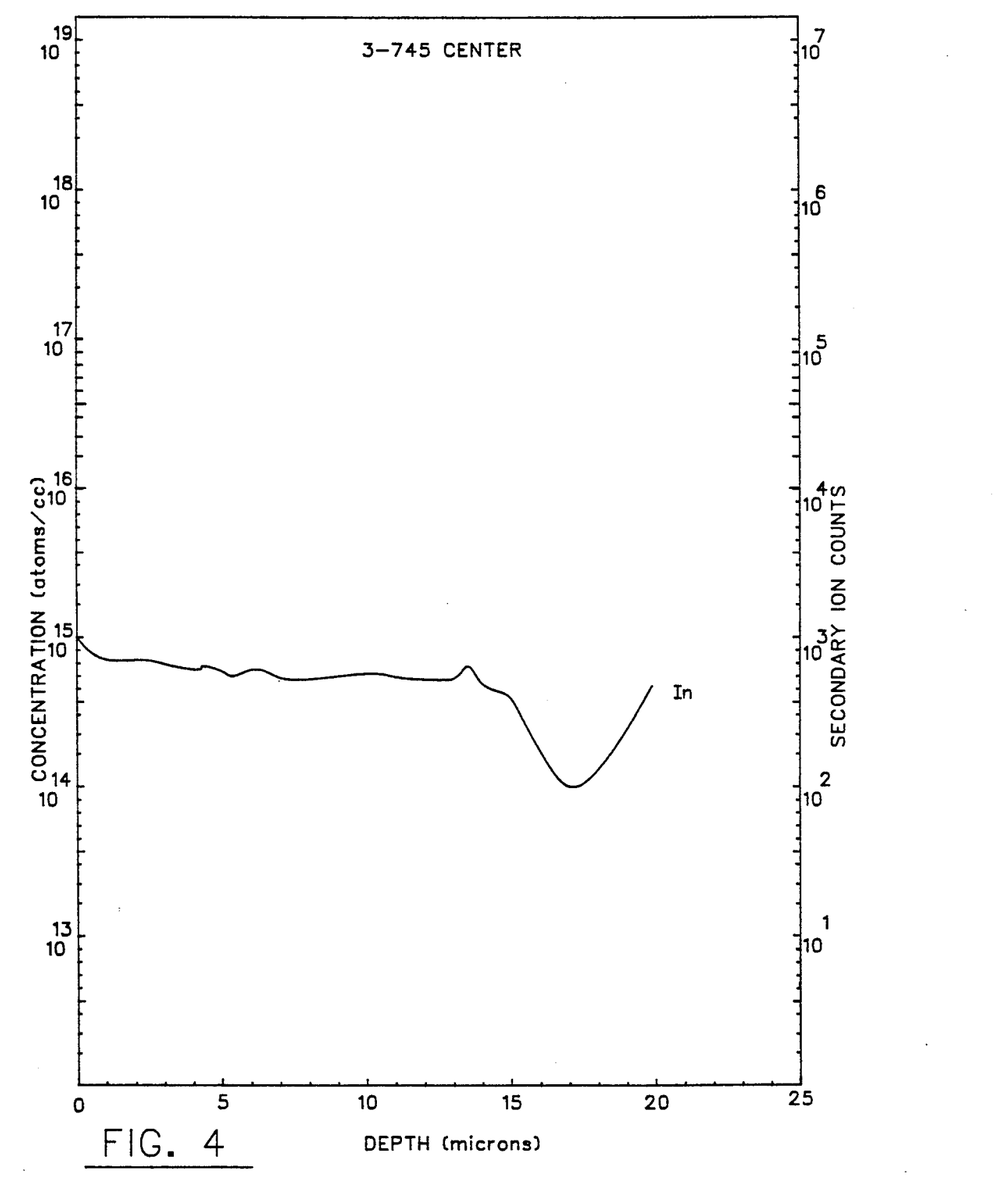
FIG. 4 is a secondary ion mass spectroscopy (SIMS) profile of the dopant species concentration in the semiconductor material, which for this example is mercury cadmium telluride, showing an average concentration of indium at $9 \times 10^{14}$ atoms/cm$^3$, this SIMS data was taken approximately at the center of the wafer.
Figure 5:
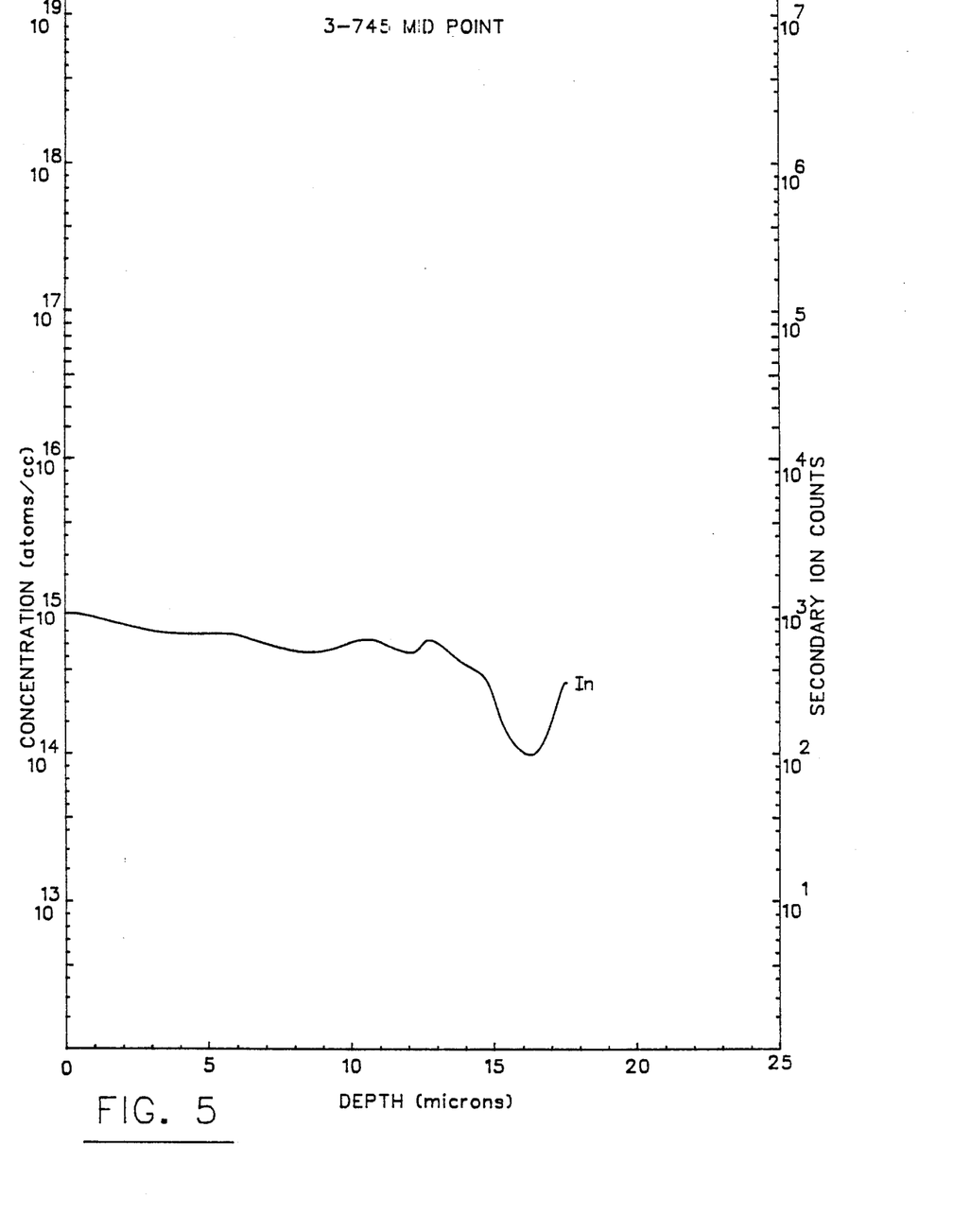
FIG. 5 is a SIMS profile taken from midway between the center and edge of the same 2 inch diameter wafer, with the same measured average dopant density as the center point (FIG. 4)
Figure 6:
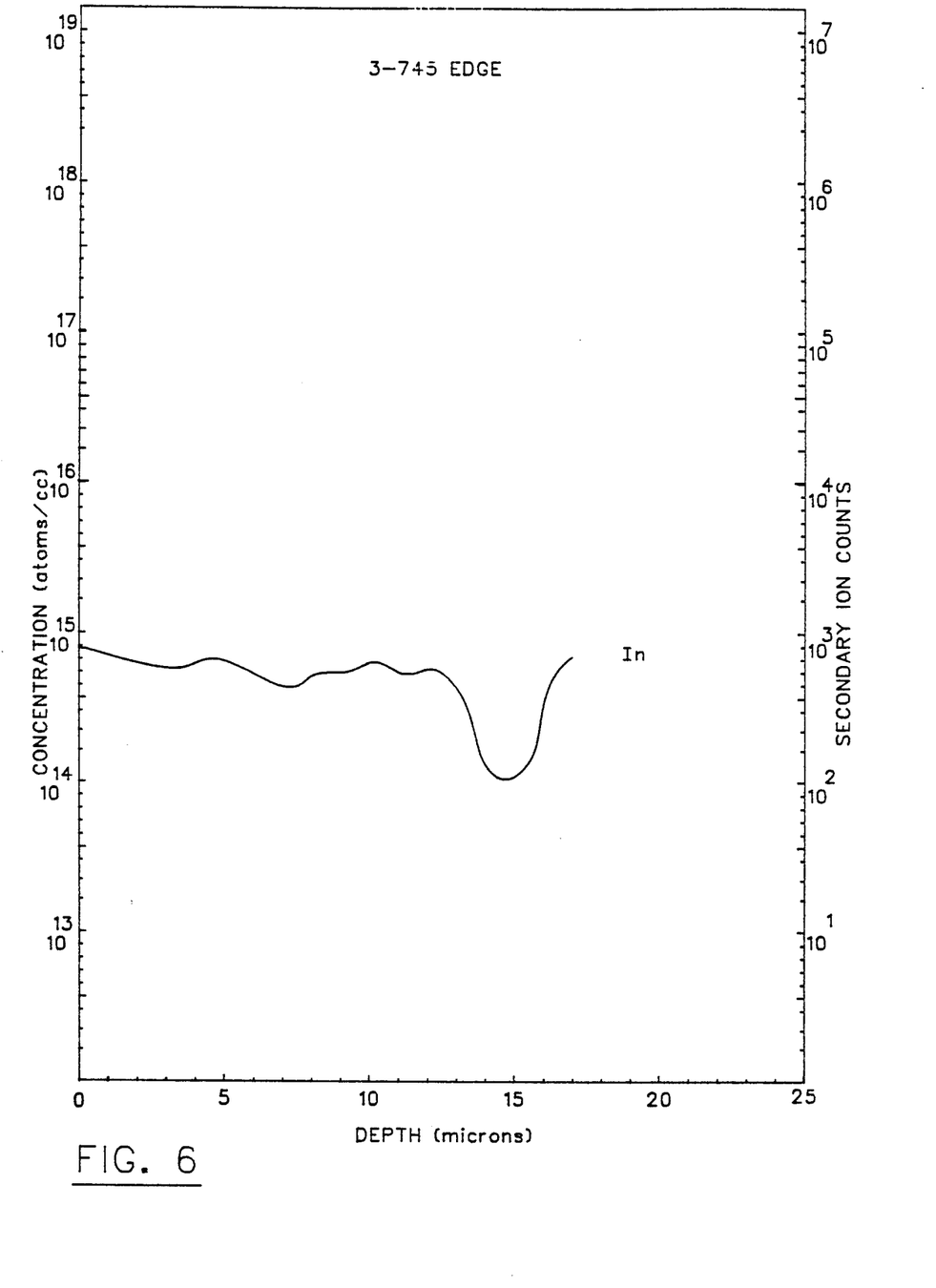
FIG. 6 is a SIMS profile from the edge (0.875 inches from the center) of the same wafer, and shows essentially the same average dopant concentration as the midway and center points of the wafer.
Figure 7:
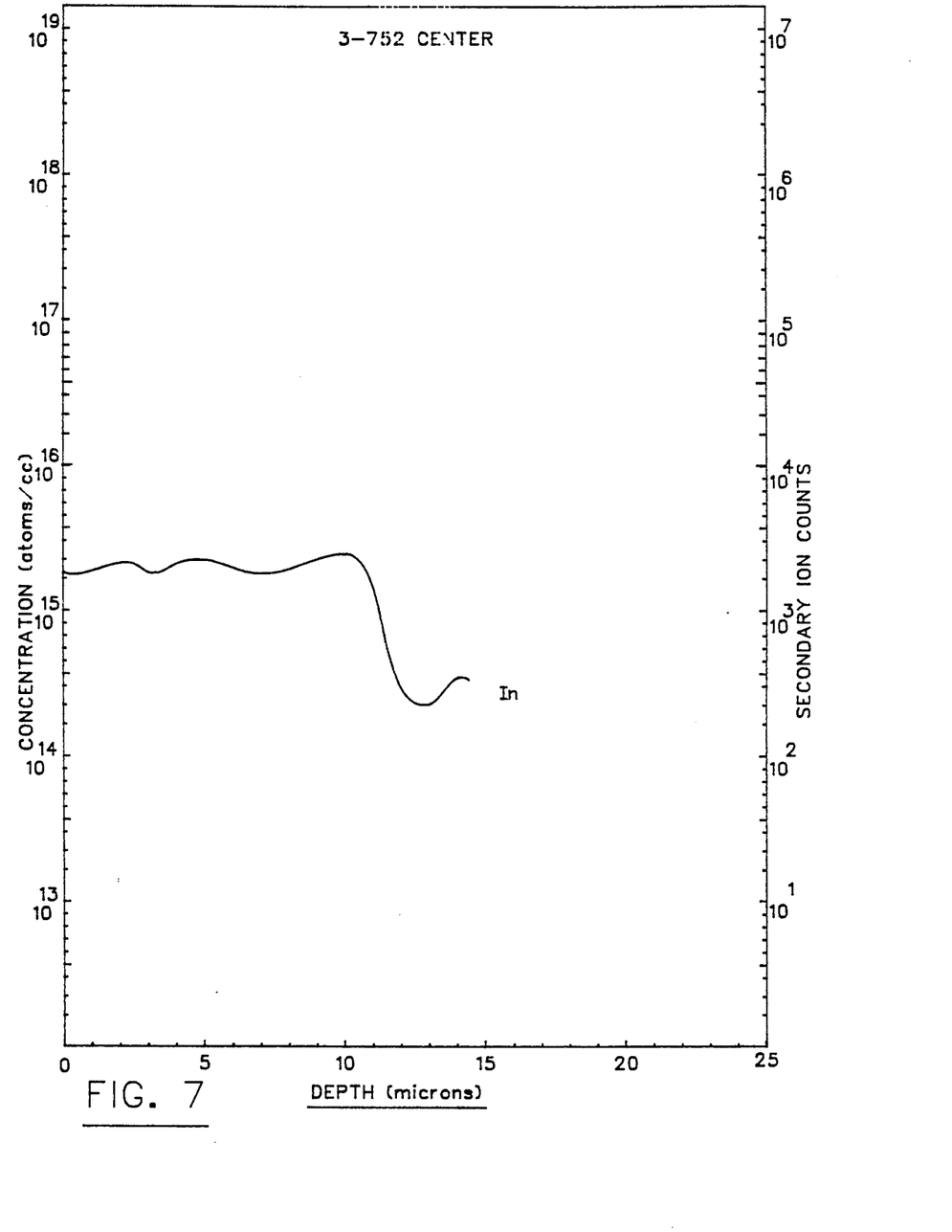
FIGS. 7, 8, and 9 are SIMS profiles of another indium doped mercury cadmium telluride sample and show an average dopant concentration of $\sim 2 \times 10^{15}$ atoms/cm$^3$ and a uniformity of 13.6%.
Figure 8:
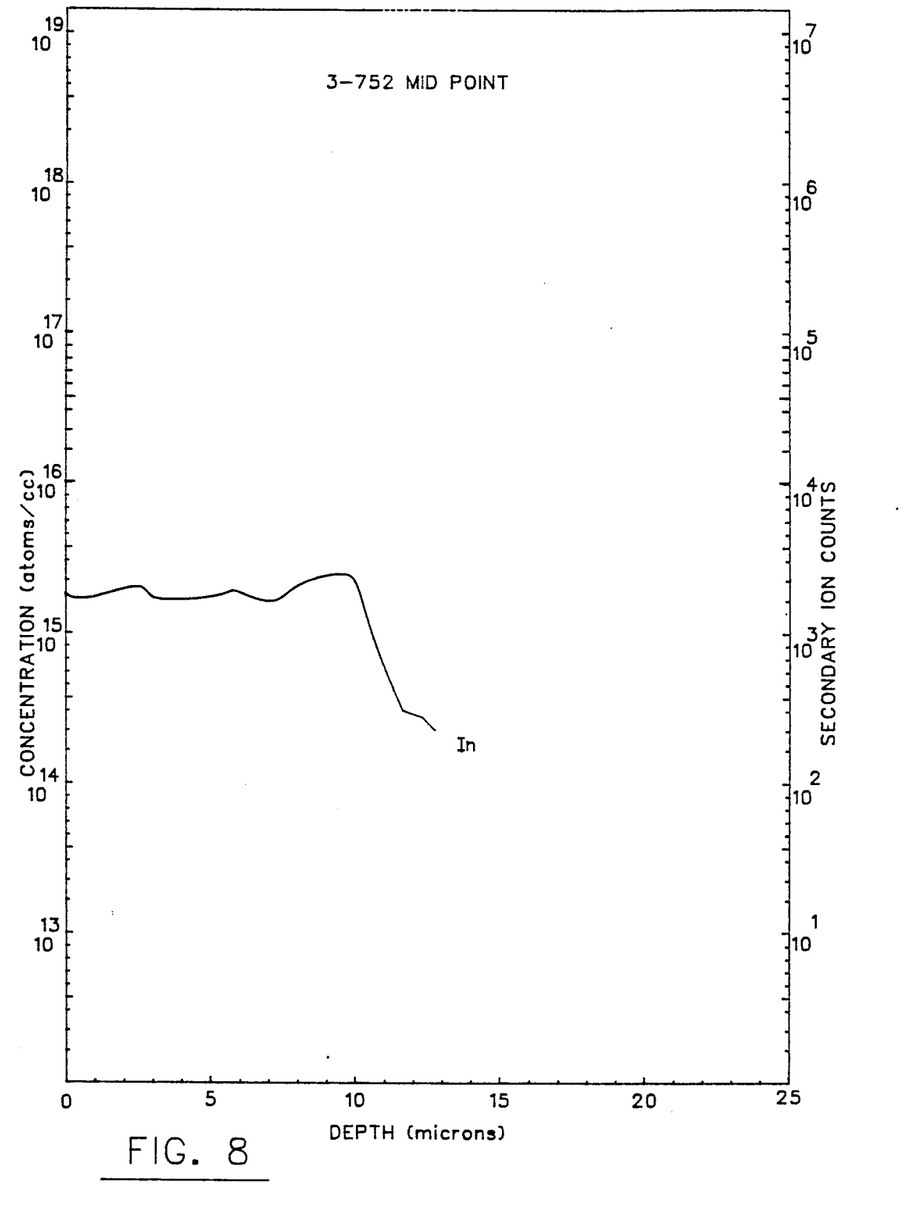
Figure 9:
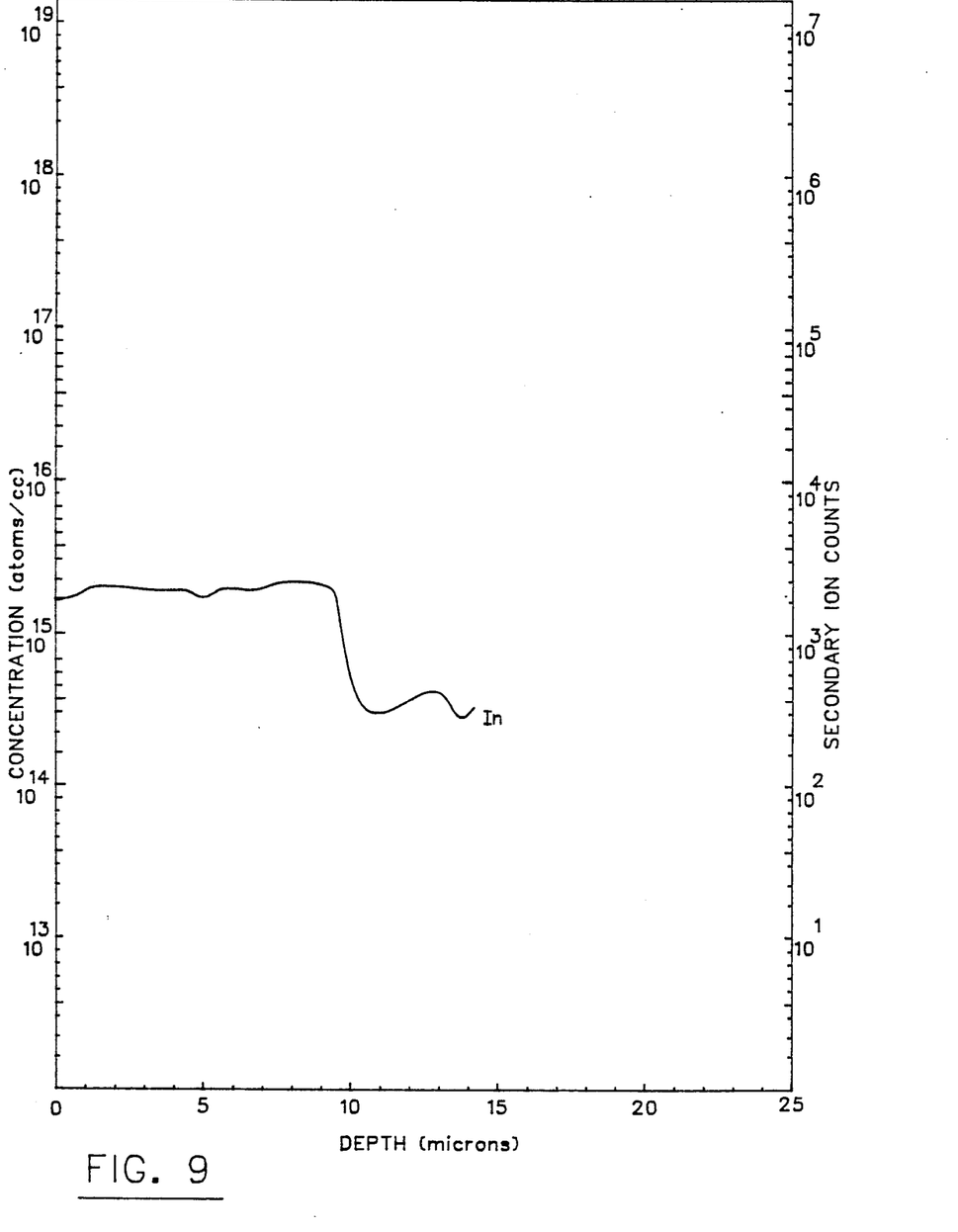

From FIGS. 3 and 3A, it will be seen that, by way of example, the graphite block 21 may be approximately 11 centimeters in length with the indium source 31 being approximately 6 centimeters from the center of the substrate 27.

From the temperature chart of FIG. 3, it can be seen that the substrate is at approximately 400° C. and the indium source 31 is at about 350° C. as a result of the RF heating of the graphite block or susceptor 21.

MERCURY CADMIUM TELLURIDE, INDIUM DOPED

In the preferred embodiment, the materials provided at the inlet 17 (FIG. 1) for entering the reactor vessel 15 are:
dimethyl cadmium
dimethyl tellurium
dimethyl zinc
di-isopropyl tellurium flowed through an elemental mercury source, and
a carrier gas of high purity hydrogen.
Also, elemental indium 31 is located on the susceptor 21.

Three basic cycles (depositing layers of zinc telluride, cadmium telluride and alternating layers of cadmium telluride and mercury telluride) are utilized for developing the finished mercury cadmium telluride semiconductor, doped to a predetermined concentration by indium.

Essentially, these basic cycles are carried out in utilizing the interdiffused multilayer process (IMP) to produce mercury cadmium telluride, which is set forth more fully in the prior art as U.S. Pat. Nos. 4,650,539 and 4,566,918, Irvine et al., relating to interdiffused multilayer processing, which are hereby incorporated by reference.

In the instant invention, precisely controlled doping of all of the layers will be carried out throughout the process, now to be described.

The preferred substrate 27 is gallium arsenide with a crystallographic orientation of $<100> 10° \rightarrow <110>$ (i.e.) with the $<100>$ plane oriented 10 degrees toward the $<110>$ plane. This orientation is selected because of convenience and improved yield, but other orientations can be used for lattice matching. The substrate 27 is purchased from any of several commercial sources with the predetermined orientation.

Figure 12:
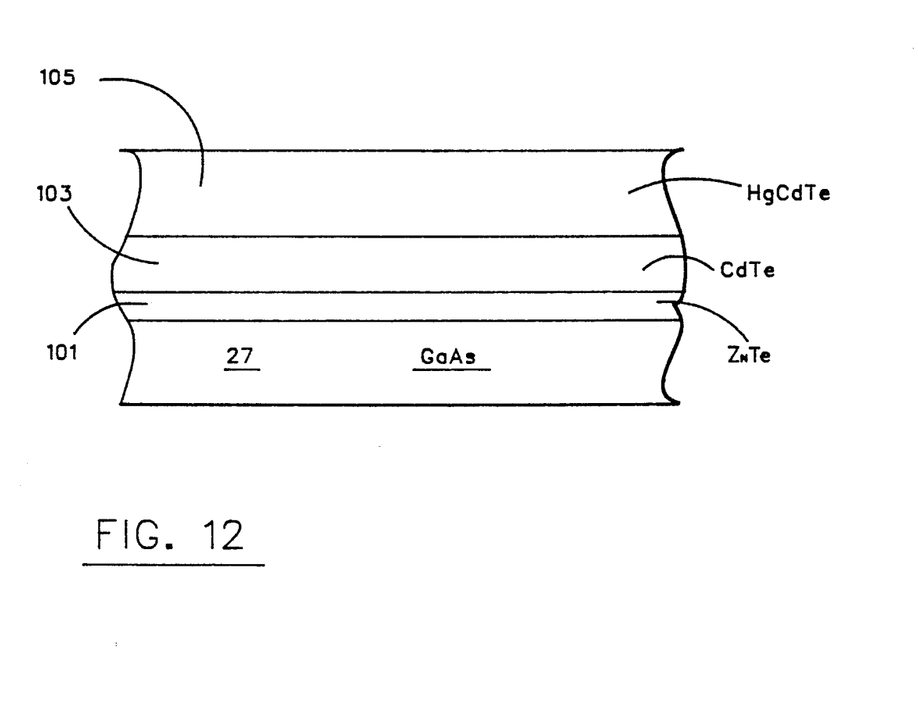

First, a thin layer of zinc telluride 101 (FIG. 12) is laid down on the gallium arsenide substrate 27 of FIG. 1. This is accomplished by entering into inlet 17 of FIG. 1, dimethyl zinc and dimethyl tellurium, using a carrier gas of highly purified hydrogen, with the temperature of the susceptor in the reactor being approximately 400° C. due to the radio frequency heating of the graphite block 21. This creates reactive species, some of which combine into zinc telluride and methyl indium, the indium coming from the commonly heated dopant source target 31. It is known that the vapor pressure of elemental indium at 350° C. is approximately $10^{-11}$ Torr which is extremely small so it does not account for the indium doping or transport that is obtained by this process. Thus, it is believed that the methyl radicals transport the indium 31 in a vapor phase. The process is allowed to proceed until approximately 1000 angstroms or less of thickness is developed in the zinc telluride layer which becomes the first, or primary, growth matrix.

The dimethyl zinc for the first cycle is stored at 0° C. under 127.4 mm pressure. The dimethyl tellurium is also stored at 0° C. under 13.8 mm pressure.

The dimethyl cadmium is stored as a liquid in a source container at 0° C. under 9.7 mm pressure. The di-isopropyl tellurium is stored at 32° C. under 5.6 mm pressure. These liquids are selectively all carried to inlet 17 by carrier gas hydrogen at 1 atmosphere ambient from their sources in conventional carrier gas manner.

Then, the input materials to inlet 17 are changed so that a layer of cadmium telluride 103 (FIG. 12) is grown over the zinc telluride 101 with the indium dopant attaching to the primary matrix 101 and being deposited during the growth of the cadmium telluride 103. To accomplish this step, dimethyl cadmium and dimethyl tellurium are the materials entered into inlet 17 so that reactive species are developed and indium is transported during the growing of the cadmium telluride layer, again by the methyl radicals, to provide doping during this processing step.

The final step involves alternately growing a thin layer of cadmium telluride, approximately 230 angstroms and stopping the process, and then, growing a thin layer of mercury telluride of approximately 770 angstroms, and then stopping the process and reverting to the growing of a thin layer of cadmium telluride. This alternate processing is repeated for perhaps 100 times, or until the mercury cadmium telluride layer reaches approximately 10 microns in thickness. The period of cadmium telluride growth is approximately 30 to 40 seconds and the period of mercury cadmium telluride is approximately 40 to 60 seconds with these alternate cycles being continued until the desired thickness of the mercury cadmium telluride layer is obtained. After growth is terminated, the structure is annealed at 400° C. for 10-30 minutes to interdiffuse the growth constituents for complete homogenization of tile material.

The materials for these interdiffused steps comprise di-isopropyl tellurium, and elemental mercury through which the di-isopropyl tellurium is flowed at a temperature of about 220° C. outside of the reactor so that the combination is introduced into inlet 17. Dimethyl cadmium is also introduced into inlet 17 to provide the cadmium for combination with the other elements for developing the ternary semiconductor mercury cadmium telluride.

Purging is carried out between each layer growth cycle, by flushing with hydrogen gas for about 10 seconds.

The flows and temperatures of these gases can change in order to vary the binary growth rates (mercury telluride or cadmium telluride) or to alter the stoichiometric ratio. Most of the transport occurs during the cadmium telluride cycle when there is an abundant source of free methyl radicals. However, indium incorporates more efficiently into mercury telluride, so the incorporation rate peaks at the mercury telluride or cadmium telluride interface. The flow of the methyl containing precursors, e.g., organometallic compounds present, will alter the transport rate of dopant to the epi-layer, as will the number of interdiffused multilayer process interfaces.

The pressure in the reactor vessel 15 is typically one atmosphere (total pressure) or slightly above (10%). However, this doping technique could be used with reduced pressure operation down to approximately 0.1 atmosphere. The lowest pressure for mercury cadmium telluride growth by MOCVD reported in the literature is 0.5 atmospheres (lower pressures are impractical because of the difficulties in maintaining mercury pressure).

MOCVD is not typically done above 1 atmosphere because it is carried out in hydrogen and the risk of leakage and consequential explosion is too great. However, under some circumstances it may be advantageous to risk higher pressures.

Rotation of the substrate 27 is realized by an external motor (not shown), connected to a drive shaft which enters the reactor 15 via an O-ring seal. This shaft couples with a turnable insert 25 in the susceptor 21 made of graphite. Rotation speeds are on the order of 5 rotations per minute.

The RF heating circuit for the susceptor graphite block 21 uses a Eurotherm temperature controller with a chrome alumel thermocouple placed in a re-entrant quartz tube in the center of the graphite susceptor 21. The typical temperature profile along the axial direction of flow, on the top surface of the substrate/susceptor is indicated in FIG. 3. The control thermocouple indicated 400° C. throughout the collection of data for the chart of FIG. 3. The heat is mainly transferred by conduction along the graphite block 21 from the substrate 27 region to the indium 31 region.

Two types of indium target have been used for free radical doping. The first comprises evaporated indium dots 10 micrometers thick, and the other, sections of indium wire, typically 0.2 mg in weight. The dots have a higher surface area to volume ratio than the wire source and characteristically show high concentrations at the start of growth, depleting towards the end. The diameter of the dots is a function of mass. For a 0.1 mg mass, a 0.012 inch diameter sphere is used. For a 0.2 mg mass a 0.015 inch sphere is used, and for 0.3 mg mass, a 0.017 inch diameter sphere may be used. These spheres may be commercially purchased. The diameter of the indium wire used was 0.015 inches.

Either type of dopant source may be selected to be mounted on graphite block 21, adjacent to the substrate such as gallium arsenide or sapphire, shown at 27. Once the size and weight of the indium source 31 are chosen, the concentration of indium in the epitaxial layer is governed by the source temperature, methyl concentrations, interdiffused multilayer process frequency and substrate temperature.

Since each piece of equipment is different from any other piece of equipment, some adjustments in the amounts of input quantities may be necessary. However, as a guide to setting the estimated or general figures, the molar ratio of cadmium to telluride is between 1.5 and 2 to 1. This is the concentration measure of the input materials. The zinc to tellurium ratio is between 0.5 and 2 to 1. The dimethyl telluride to mercury molar ratio is 0.0048, dimethyl cadmium to mercury is 0.0072, di-isopropyl to mercury is 0.04, and the actual molar amounts of mercury injected is approximately 0.003 mole/min.

The indium source is liquid at the preferred temperature of 400° C. to provide reaction with the input alkyls.

Figure 10:
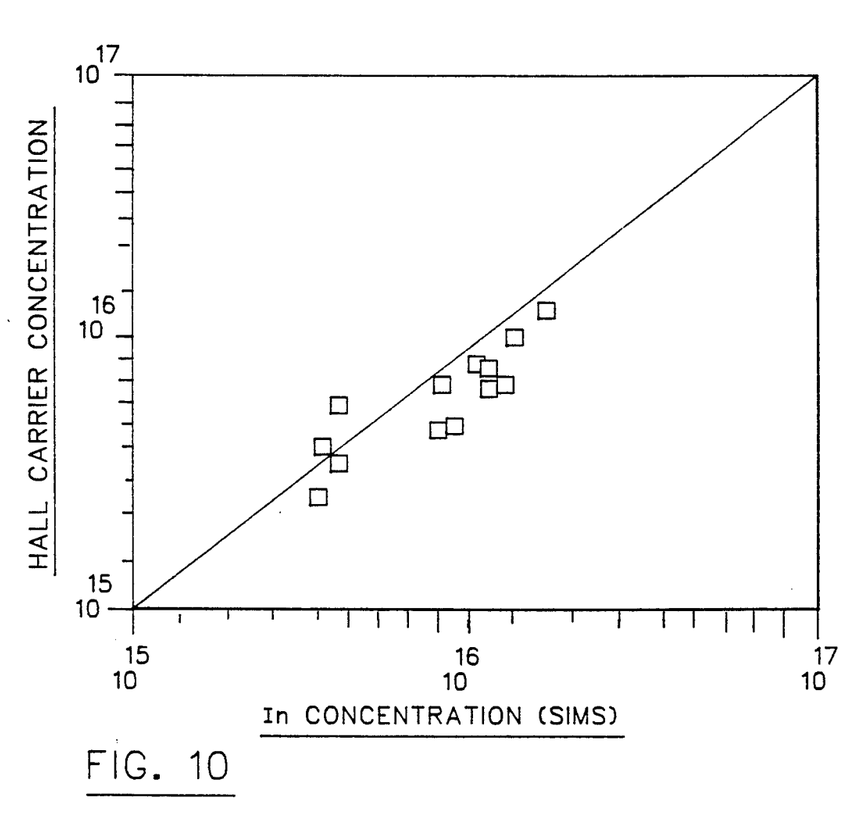
FIG. 10 is a plot of Hall carrier concentration, which is the net N type electron concentration due to indium, versus indium concentration (SIMS) and shows approximately 100% activation of the species as an n-type donor dopant.

FIGS. 4-9 show the doping concentration for a series of indium doped mercury cadmium telluride material layers using this configuration. In this series, the reproducibility and control of the indium dopant concentrations is excellent, and is better than has been demonstrated with any other known technique. These figures show typical Secondary Ion Mass Spectroscopy (SIMS) sputter depth profiles of the indium doping concentrations. These are all graphs of the samples of the same wafer, spaced at the specified locations. These profiles indicate that the dopant species is very uniform with depth, and also has outstanding spatial uniformity. In FIG. 10, the chart shows that the donor concentration is controlled by the indium dopant. The correlation between the Hall carrier concentration in atoms per cubic centimeter and the indium concentration (SIMS) in atoms per cubic centimeter is very good, and proves that the carrier concentration is being controlled by the intended dopant.

Figure 11:
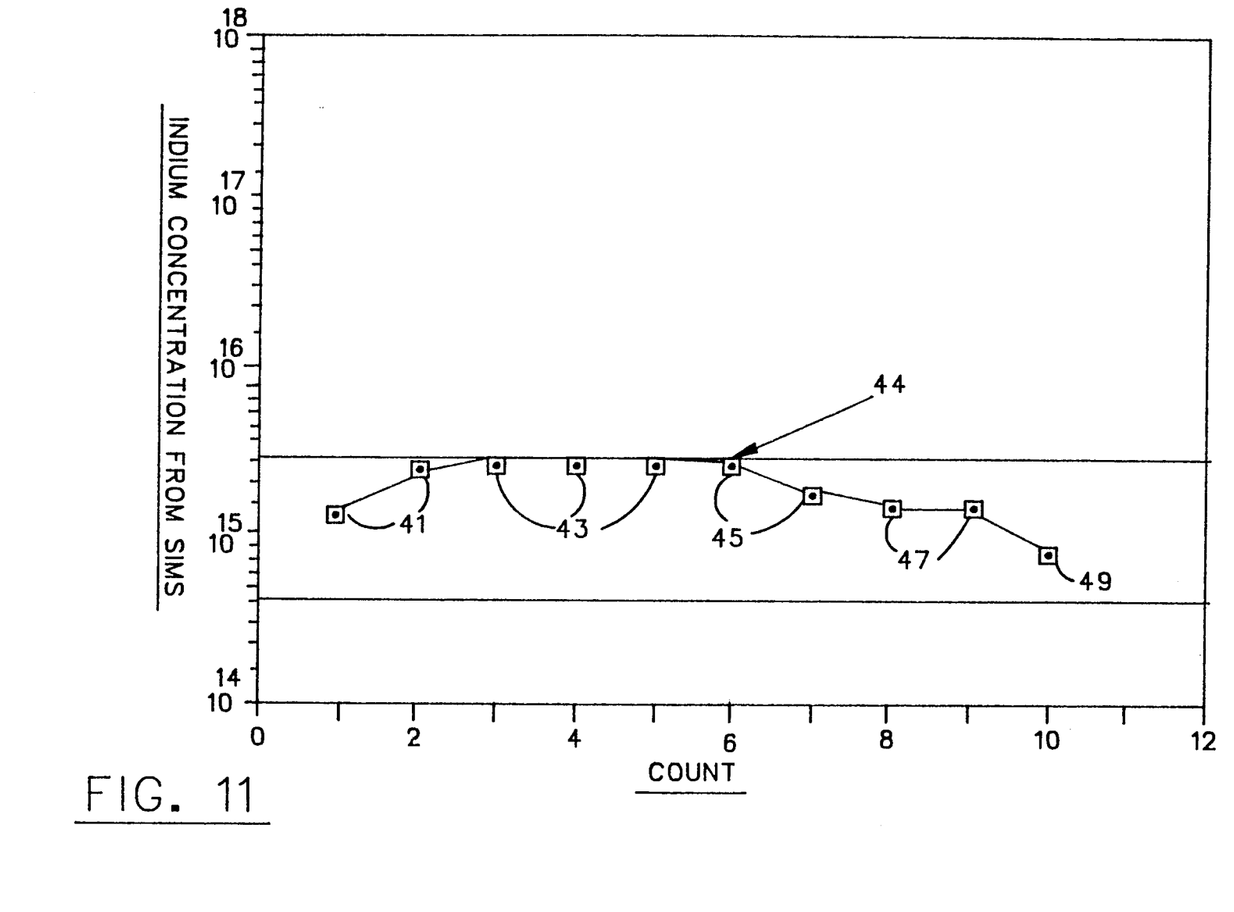
FIG. 11 shows a consecutive series of indium doped wafers, in different runs, to show the precision and reproducibility of this technique, and illustrates controllability following intentional dopant flux reduction; and, FIG. 12 shows a ternary mercury cadmium telluride semiconductor doped in accordance with a preferred method of the present invention.

In FIG. 11, in a different run from the wafers of the prior figures, the chart is provided to show that the indium concentration targeting is precise and highly reproducible. For example, the first two data bits on the left, shown at 41, indicate that the target level is being calibrated. The next three bits of data 43 show that the indium level is precisely maintained once the calibration is determined, and can be reproducibly accomplished. The data shown at 45 indicates that the indium level can be intentionally reduced, as is proven by the chart. The data shown at 47 shows that the indium level can be stabilized, at a lower level. And the data shown at 49 indicates that the doping level can be further reduced, in this case into the $10^{14}$ atom/cm$^3$ range.

Thus, in general, while a working temperature of approximately 400° C. is given in the preferred example, usually temperatures in the range of 300°-500° C. may be employed as the operating temperatures. It should be noted that the flux or the concentration of the dopant which is transported is a function of the amount of methyl radicals, the temperature of the dopant source.

It should now be realized that elemental indium may be used as a doping species whereas heretofore it must have been included in at least a volatile compound to provide even non-reproducible doping at low concentrations. Thus, the vapor phase technology herein disclosed is the very cutting edge for free radical transport of the dopant species.

While matrix elements may have been transported for the primary growth matrix, they make up the compound semiconductor, but they do not control the electrical properties of the semiconductor which add electrons or leave holes to accept electrons in the form of the dopant species.

It should be emphasized that the subject method provides reproducible doping in MOCVD processing. In other words, the transport of the indium is by virtue of the reactive indium-alkyl which is formed in the reactor, and exists in the form of a gas which is flowing in the reactor system.

All of the prior art citations (supra) are hereby incorporated into this disclosure by reference.

While a preferred method of practicing the invention has been set forth, it should be apparent that many other embodiments of the invention can be made using the principles taught herein, and accordingly, the invention is intended to be limited only by the attached claims wherein:

What is claimed is:

1. A method for precisely and reproducibly establishing levels of indium dopant in mercury cadmium telluride semiconductor material comprising the steps of:
    (a) heating elemental indium in a chamber to form a metallic source;
    (b) selectively introducing gases as a gas stream to said chamber comprising at least elemental mercury in vapor form, organo-metallic zinc, organo-metallic tellurium, and organo-metallic cadmium in a carrier gas for reaction therein to form mercury cadmium telluride at a heated site downstream of the indium; and
    (c) transporting indium from the metallic source by free aliphatic radicals to the mercury cadmium telluride material being formed in said chamber in close proximity to said metallic source, the radicals being liberated during the mercury cadmium telluride reaction formation.

2. The method of claim 1, wherein:
   said gases include dimethyl cadmium, dimethyl tellurium, dimethyl zinc; and,
   dimethyl tellurium forced through elemental mercury.

3. The method of claim 1, wherein:
   the molar ratio of cadmium to tellurium is approximately in the range 1.5-2, cadmium to 1 tellurium, and the zinc to tellurium ratio is between 0.5 and 2, zinc to 1 tellurium.

4. A method for precisely and reproducibly establishing levels of indium dopant in mercury cadmium telluride comprising the steps of:
    (a) heating a source of indium in an MOCVD chamber;
    (b) introducing a gas flow comprising a carrier gas and selectively:
        (1) dimethyl cadmium gas,
        (2) dimethyl tellurium gas,
        (3) dimethyl zinc gas, and
        (4) diisopropyl tellurium gas forced through elemental mercury, into the chamber for reaction therein; and
    (c) transporting indium from the source to the mercury cadmium telluride heated growing site in said chamber in close proximity to said source by free methyl radicals obtained from said gases during the mercury cadmium telluride reaction formation.

5. The method of claim 4, wherein:
   said chamber is maintained at a temperature in the range of 300° C. to 500° C.

6. A method for precisely and reproducibly establishing levels of indium dopant in mercury cadmium telluride semiconductor material comprising the steps of:
    (a) heating a source of indium in a MOCVD reactor to a temperature in the range 300°-500° C.;
    (b) introducing gases comprising at least elemental mercury in vapor form, dimethyl zinc, dimethyl tellurium, and dimethyl cadmium into a reactor for reaction therein to form mercury cadmium telluride at a heated site downstream of the indium; and
    (c) transporting indium from the metallic source by free methyl radicals into the mercury cadmium telluride material being formed in close proximity to said metallic source, the radicals being liberated during the mercury cadmium telluride reaction formation.

7. The method of claim 6, wherein:
   said gases include dimethyl cadmium, dimethyl tellurium, dimethyl zinc; and,
   dimethyl tellurium forced through elemental mercury at about 220° C.

8. The method of claim 6, wherein:
   the molar ratio of cadmium to tellurium is approximately in the range 1.5-2 cadmium to 1 tellurium, and the zinc to tellurium ratio is between 0.5 and 2 zinc to 1 tellurium.

9. A method for precisely a reproducibly establishing levels of indium dopant in mercury cadmium telluride being formed on a heated substrate comprising the steps of:
    (a) heating a source of indium in a reactor;
    (b) introducing gases in a flowing gas carrier elemental mercury in vapor form, an alkyl of zinc, an alkyl of tellurium, and an alkyl of cadmium, wherein the alkyl is at least one of dimethyl and diisopropyl, into a reactor for reaction therein; and
    (c) disposing the substrate in close proximity to said source in the reactor; and
    (d) transporting the indium, from the source to said substrate for mercury cadmium telluride, by mainly free methyl radicals obtained from said gases by liberation during the mercury cadmium telluride reaction formation.

10. The method of claim 9, wherein:
    first, dimethyl zinc and dimethyl tellurium are introduced to the reactor to establish a layer of zinc telluride on said substrate;
    next, dimethyl cadmium and dimethyl tellurium are introduced to the reactor to establish a layer of cadmium telluride over the zinc telluride;
    finally, dimethyl tellurium and dimethyl cadmium are introduced into the reactor alternately with di-isopropyl flowed through elemental mercury and with dimethyl tellurium and dimethyl cadmium to deposit alternating layers of cadmium telluride and mercury cadmium telluride; and,
    said indium atoms doping all layers being formed.

11. The method of claim 10, wherein:
the alternating period of cadmium telluride layer growth requires about 30 to 40 seconds interspaced with about 40 to 60 seconds of mercury cadmium telluride growth.

12. The method of claim 11, wherein:
the alternating growth is continued for about 100 times until the mercury cadmium telluride is about 10 microns in thickness.

13. The method of claim 12, further comprising the step of:
annealing after the alternating growth is completed to merge the layers into homogeneous mercury cadmium telluride.

14. A method of forming an indium doped mercury cadmium telluride semiconductor on a substrate using metalorganic chemical vapor deposition techniques which comprises:
providing heated target material of metallic indium in a chamber proximate the substrate on which the mercury cadmium telluride semiconductor is being deposited; and,
feeding to said chamber a mixture of gases comprising:
dimethyl cadmium
dimethyl tellurium
dimethyl zinc, and
di-isopropyl tellurium flowed through elemental mercury in a carrier gas under conditions which will create gaseous metalorganic species of said indium for transport of indium dopant to said semiconductor material as it is deposited.

15. The method of claim 14, wherein:
the temperature of said substrate is between 300° and 500° C.

16. The method of claim 15, wherein:
the metallic indium is located upstream of the substrate in the gas feed.

17. The method of claim 16, wherein:
the temperature of said substrate is maintained at approximately 400° C. and the temperature of said indium material is at approximately 350° C.

* * * * *